United States Patent [19]
Higgins

[11] Patent Number: 5,293,140
[45] Date of Patent: Mar. 8, 1994

[54] TRANSMISSION LINE STRUCTURE

[75] Inventor: Robert J. Higgins, Sunrise, Fla.

[73] Assignee: Motorola, Inc., Schaumburg, Ill.

[21] Appl. No.: 908,622

[22] Filed: Jun. 29, 1992

Related U.S. Application Data

[63] Continuation of Ser. No. 636,963, Jan. 2, 1991, abandoned.

[51] Int. Cl.$^5$ ............................................. H01P 3/08
[52] U.S. Cl. .................................... 333/204; 333/219; 333/238; 333/246; 174/117 F; 174/117 FF
[58] Field of Search ............... 333/204, 219, 238, 246, 333/219.1; 174/117 F, 117 FF

[56] References Cited

U.S. PATENT DOCUMENTS

| | | | |
|---|---|---|---|
| 3,835,420 | 9/1974 | Orime et al. | 333/238 |
| 3,879,690 | 4/1975 | Golant et al. | 333/238 |
| 4,157,517 | 6/1979 | Kneisel et al. | 333/205 |
| 4,609,892 | 9/1986 | Higgins, Jr. | 333/204 |
| 4,785,271 | 11/1988 | Higgins, Jr. | 333/204 |
| 4,918,050 | 4/1990 | Dworsky | 333/204 |
| 4,940,955 | 7/1990 | Higgins, Jr. | 333/204 |
| 4,963,843 | 10/1990 | Peckham | 333/204 |
| 4,975,664 | 12/1990 | Ito et al. | 333/204 |
| 5,162,761 | 11/1992 | Kita et al. | 333/204 |

FOREIGN PATENT DOCUMENTS 0060303  2/1990  Japan ................... 333/219

Primary Examiner—Robert J. Pascal
Assistant Examiner—Michael B. Shingleton
Attorney, Agent, or Firm—Pedro P. Hernandez

[57]  ABSTRACT

A microstrip or stripline structure (10) is disclosed. A dielectric substrate (11) of ceramic includes an area (14) having a different electromagnetic characteristic. The differing dielectric characteristic can be provided by an area (14) in the substrate having a reduced thickness. A transmission line (13) is disposed on one side of the substrate and is partially disposed on the area of reduced thickness. An opposed conductor, such as a ground plane (12), is disposed on the opposite side of the substrate. For a microstrip (20), two such substrates are utilized.

6 Claims, 2 Drawing Sheets

5,293,140

TRANSMISSION LINE STRUCTURE

This is a continuation of application Ser. No. 07/636,963, filed Jan. 2, 1991, and now abandoned.

TECHNICAL FIELD

This invention relates generally to transmission line structures, and particularly to a transmission line structure formed on a substrate.

BACKGROUND

Transmission line structures, such as resonators or filters, can be formed on dielectric substrates. For example, conventional stripline or microstrip resonators typically utilize a substrate which can be a ceramic or another dielectric material. For microstrip construction a metallized runner is formed on one side of the substrate with a ground plane on the other side. The stripline configuration utilizes two such structures with ground planes on the outside and the runner therebetween. A number of factors, including the dielectric constant of the substrate, the thickness of the substrate, and the length and width of the runner determine the resonant frequency of the resonator. Practical resonators and filters for high frequency, such as above 1 GHz, can be readily constructed utilizing such techniques with resonator lengths under 2 cm. It can be difficult to provide filters for lower (e.g. VHF) frequency ranges in a similar size using a similar manufacturing process. Various techniques, such as widening the capacitive end of the line or using a serpentine layout to increase the line length having been utilized to reduce the physical length required for resonance. These approaches require increased surface area of the substrate, and generally degrade the quality of the resonator.

Another approach, to resonate a transmission line filter at a lower frequency, involves the use of a lumped capacitive element, such as a chip capacitor which is connected to the transmission line structure. A disadvantage of this approach is that it is not readily tuneable. When a lumped capacitive element is not utilized, the frequency of a resonator can be readily trimmed by removing portions of the ground plane element disposed opposite to the capacitive end of the line. When a substantial portion of the capacitance is supplied by a lumped element, the removal of the ground plane has minimal effect on the capacitance, and hence, the resonant frequency of the resonator.

SUMMARY OF THE INVENTION

This stripline structure includes a substrate having a portion with a differing electromagnetic characteristic for providing a desired operating characteristic. One aspect of the invention, the transmission line structure includes a dielectric substrate having opposed sides. A transmission line is disposed on one of the sides, while an opposed conductor is disposed to the other sides. The dielectric substrate has a portion of differing electromagnetic characteristics and the transmission line is partially disposed on said area of differing electromagnetic characteristics.

DETAILED DESCRIPTION OF THE PREFERRED EMBODIMENT

Figure 1:
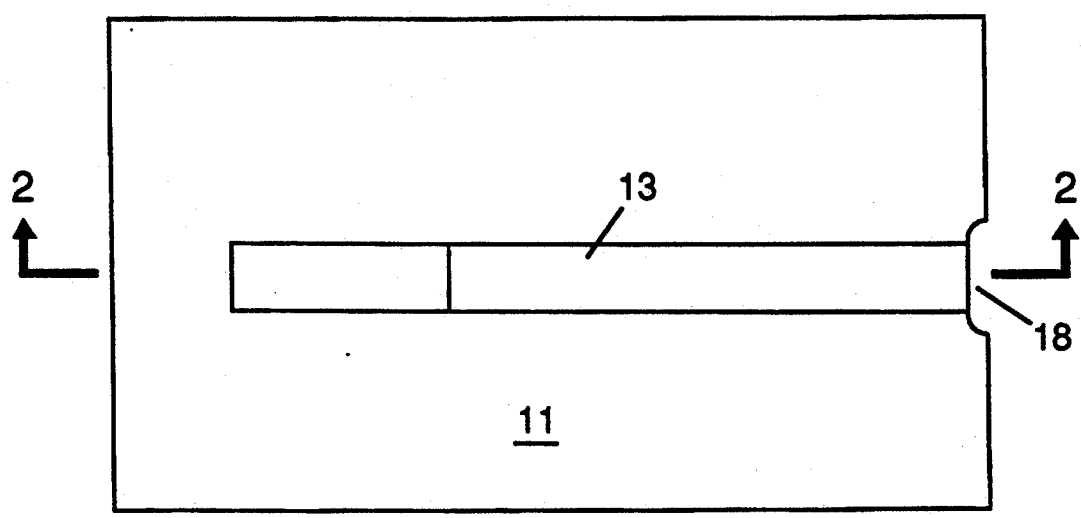
FIG. 1 is a top plan view of a transmission line structure in accordance with the present invention.
Figure 2:
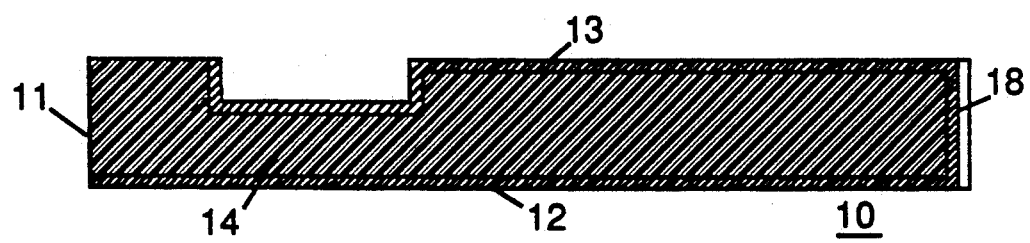
FIG. 2 is a cross-sectional view taken on line 2—2 of FIG. 1

Referring now by characters of reference to the drawings and first to to FIGS. 1, and 2, it will be understood that transmission line structure, comprising a microstrip filter 10, includes a substrate 11 having a conductive ground plane 12 disposed of one of its sides and a conductive line 13 disposed on the opposed other side. The ground plane 12 provides an opposed conductor to the conductive line 13. The substrate 11 includes an area 14 of reduced thickness, with the line 13 extending at least into this area. At the area 14, the line 13 is more closely spaced to the ground plane 12; thereby providing increased capacitance and decreased inductance per unit length. The conductive line 13 is shown connected to the ground plane 12 by edge metallization 18, as is conventional in a quarter wavelength resonant line. If desired, one or more tap connections can be provided to conductive line 13.

Since ceramic substrates are typically manufactured from multiple layers of a ceramic tape, the forming of an area of reduced thickness 14 can be accomplished by punching a hole in one of the layers of a "green" (unfired) tape prior to the assembling and firing of the substrate, thereby providing a cavity in the substrate 11. If desired, the ground plane side could include the cavity. In the preferred embodiment the cavity is provided on the transmission line side of the substrate 11.

Figure 3:
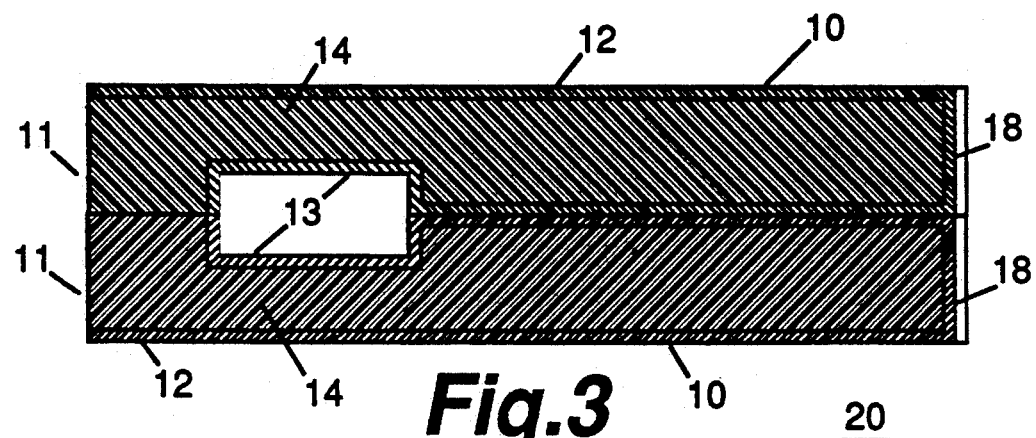
FIG. 3 is a cross-sectional view of a stripline structure in accordance with the present invention

FIG. 3 illustrates a transmission line structure 20 that is constructed as a stripline rather than as a microstrip. Two microstrip structures 10 are utilized to form the stripline filter or resonator 20. In this preferred embodiment both include the reduced substrate thickness areas to provide increased capacitance to the ground planes 12 at the open ends of conductive lines 13. Such assembly techniques for stripline filters is well known in the art.

Figure 4:
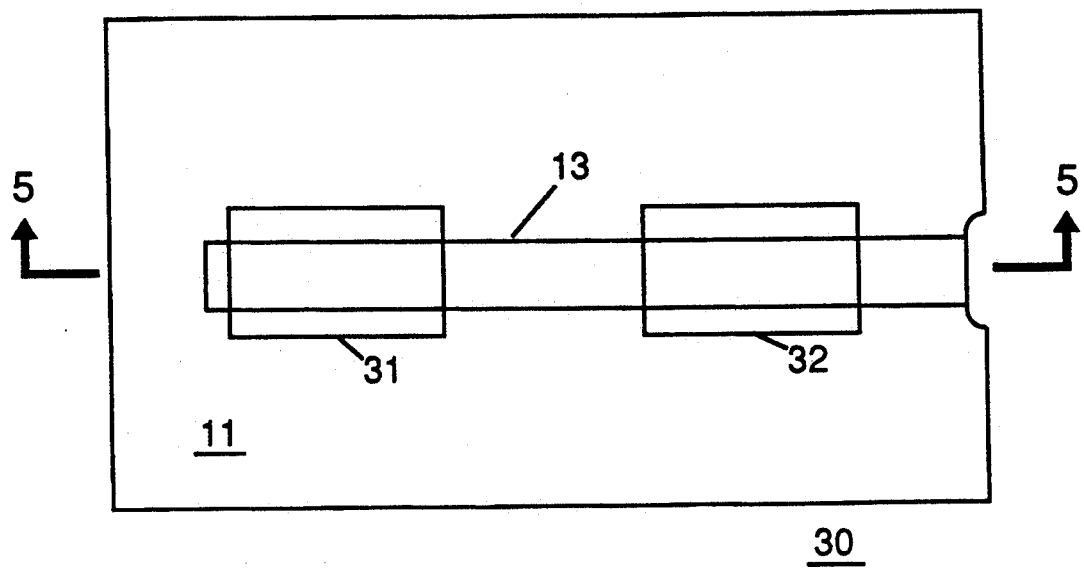
FIG. 4 is a top plan view of another embodiment of a transmission line structure in accordance with the present invention.
Figure 5:
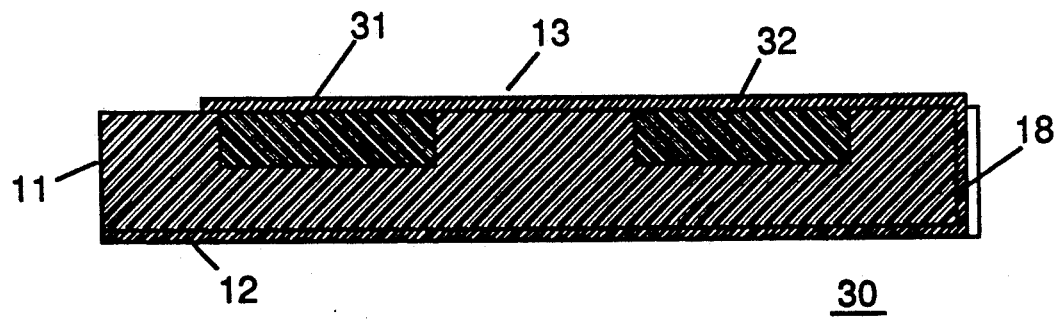
FIG. 5 is a cross-sectional view taken on line 5—5 of FIG. 4.

While the embodiments of FIGS. 1-3 provide a varying electromagnetic characteristic by disposing a portion of the line 13 in closer proximity to the ground plane 12, other characteristics could also be changed. As is illustrated in FIGS. 4 and 5, rather than utilizing the cavity or pocket in the ceramic substrate 11, one or more plugs of ceramic material having a differing dielectric constant or other characteristics, can be inserted while the ceramic substrate 11 is still in the green unfired state. The transmission line runner 13 extends over an area 31 having the differing dielectric constant; thereby producing a different capacitance than that provided by other portions of the dielectric substrate 11.

At the grounded end of the transmission line 13, the inductance is determined by the distance between the runner and the ground plane. If an area 32 of material having a different permeability, such as a ceramic ferromagnetic material, is included in the substrate, the inductance can be increased.

By varying one or more parameters such as substrate thickness, or the dielectric constant or permeability of a portion of the substrate it is possible to construct a resonator or filter that utilizes less substrate surface area for a given frequency of operation. Structures can be constructed for lower frequency operation than was previously possible in a given size. As this approach does not use lumped capacitances, the structure can be readily trimmed in frequency by removing portions of the ground plane.

What is claimed is:

1. A transmission line structure comprising:
   a dielectric substrate having opposed sides;
   a conductive line disposed on one of said sides, the conductive line having a predetermined width and length;
   a ground plane disposed on the other of said sides of the dielectric substrate;
   the dielectric substrate having a cavity providing an area of reduced thickness, the area of reduced thickness having a predetermined length, width, and thickness, the width of the area of reduced thickness is substantially the same as the width of the conductive line, the conductive line is partially disposed on said area of reduced thickness and the length of the area of reduced thickness is substantially smaller than the length of the conductive line, the cavity providing for increased capacitance between the conductive line and the ground plane; and the conductive line has an open end and a shorted end, and the area of reduced thickness is found substantially at the open end of the conductive line.

2. A stripline structure comprising:
   a dielectric substrate base having first and second surfaces, a conductive line having a predetermined length disposed on the first surface of the dielectric substrate base and a metallized ground plane disposed on the second surface of the dielectric substrate base, the dielectric substrate base having a cavity providing an area of reduced thickness on the first surface and the conductive line is partially disposed on the cavity, the area of reduced thickness having a predetermined length, width and thickness, the length of the area of reduced thickness is substantially smaller than the length of the conductive line, the cavity providing for increased capacitance between the conductive line and the ground plane;
   a dielectric substrate cover having first and second surfaces, a metallized ground plane disposed on the second surface of the dielectric substrate cover; and
   said dielectric substrate base and cover being attached with their first surfaces mating to each other.

3. The transmission line structure of claim 1, wherein the dielectric substrate substantially underneath a portion of said conductive line has a portion of dielectric material which has a different dielectric constant than the rest of the dielectric material which forms the dielectric substrate.

4. The stripline structure of claim 2, wherein the dielectric substrate cover has a conductive line disposed on the first surface of the dielectric substrate cover, the dielectric substrate cover has a cavity on the first surface and the conductive line is partially disposed on the dielectric substrate cover cavity.

5. The stripline structure of claim 2, wherein the cavity has a width which is substantially equal to the width of the conductive line.

6. The stripline structure of claim 2, wherein the conductive line has an open circuit end and a grounded circuit end and the cavity is substantially closer to the open circuit end of the conductive line.

* * * * *